United States Patent [19]

Capps et al.

[11] Patent Number: 5,432,999
[45] Date of Patent: Jul. 18, 1995

[54] INTEGRATED CIRCUIT LAMINATION PROCESS

[76] Inventors: David F. Capps, 134 Moross, Mt. Clemens, Mich. 48043; Tyra M. Szwarc, 17018 Kingsbrook, Clinton Township, Macomb County, Mich. 48038

[21] Appl. No.: 210,921

[22] Filed: Mar. 21, 1994

Related U.S. Application Data

[60] Division of Ser. No. 933,359, Aug. 20, 1992, abandoned, and a continuation of Ser. No. 109,674, Aug. 20, 1993, abandoned.

[51] Int. Cl.6 .............................................. H05K 3/36
[52] U.S. Cl. ................................... 29/830; 156/630.1
[58] Field of Search ............... 156/653, 655, 901, 630; 29/830, 852

[56] References Cited

U.S. PATENT DOCUMENTS

| Re. 26,899 | 5/1970 | Dion et al. . |
| 3,761,782 | 9/1973 | Youmans . |
| 3,787,252 | 1/1974 | Filippazzi et al. . |
| 4,225,900 | 9/1980 | Ciccio et al. . |
| 4,231,154 | 11/1980 | Gazdik et al. . |
| 4,239,312 | 12/1980 | Myer et al. . |
| 4,275,410 | 6/1981 | Grinberg et al. . |
| 4,710,798 | 12/1987 | Marcantonio . |
| 4,829,018 | 5/1989 | Wahlstrom . |
| 4,840,923 | 6/1989 | Flagello et al. . |
| 4,862,249 | 8/1989 | Carlson . |
| 4,877,752 | 10/1989 | Robinson . |
| 4,897,708 | 1/1990 | Clements . |
| 4,917,759 | 4/1990 | Fisher et al. ..................... 156/653 X |
| 4,930,001 | 5/1990 | Williams . |
| 4,939,568 | 7/1990 | Kato et al. . |
| 4,953,005 | 8/1990 | Carlson et al. . |
| 4,954,875 | 9/1990 | Clements . |
| 4,954,878 | 9/1990 | Fox et al. . |
| 4,956,694 | 9/1990 | Eide . |
| 4,982,265 | 1/1991 | Watanabe et al. . |
| 4,982,266 | 1/1991 | Chatterjee . |
| 4,991,000 | 2/1991 | Bone et al. . |
| 5,025,303 | 6/1991 | Brighton . |
| 5,082,718 | 1/1992 | Chantraine et al. ............. 156/655 X |
| 5,111,278 | 5/1992 | Eichelberger . |
| 5,116,463 | 5/1992 | Lin et al. ......................... 156/655 X |
| 5,118,385 | 6/1992 | Kumar et al. .................... 156/655 X |
| 5,189,505 | 2/1993 | Bartelink . |
| 5,196,089 | 3/1993 | Takada et al. ................... 156/901 X |
| 5,199,163 | 4/1993 | Ehrenberg et al. .............. 156/630 X |

FOREIGN PATENT DOCUMENTS

8505733 12/1985 WIPO .

*Primary Examiner*—Carl J. Arbes
*Attorney, Agent, or Firm*—Basile and Hanlon

[57] ABSTRACT

A process for forming a multi-layer integrated circuit utilizes a rigid substrate covered by a dissolvable material layer, which is in turn coated by a protective material layer. Electrically conductive posts and a semiconductive material layer are then sequentially formed on the protective material layer. An integrated circuit is formed in the top surface of the semiconductive material layer. Upper conductive pads are formed on exposed ends of the conductive posts. The substrate, dissolvable material layer and protective material layer support each thin integrated circuit layer during fabrication and are removed to enable the integrated circuits to be interconnected into a stack via the conductive posts and pads. In another embodiment, the rigid substrate is formed of a dissolvable material layer which is in turn coated by a protective, insulating layer. The conductive posts and integrated circuit are formed on the substrate prior to dissolving the substrate to expose top and bottom pads attached to opposite ends of the conductive posts. The top and bottom pads of a plurality of like integrated circuits are connected to provide interconnection of multiple dies in a stacked arrangement.

15 Claims, 8 Drawing Sheets

INTEGRATED CIRCUIT LAMINATION PROCESS

CROSS REFERENCE TO CO-PENDING APPLICATIONS

This application is a divisional application of U.S. patent application Ser. No. 07/933,359, filed Aug. 20, 1992, in the name of David F. Capps and Tyra M. Szwarc, and entitled "MULTI-LAYER INTEGRATED CIRCUIT AND FABRICATION METHOD", now abandoned and a continuation of U.S. patent application Ser. No. 08/109,674 filed Aug. 20, 1993 in the names of David F. Capps and Tyra M. Szwarc and entitled "SEMICONDUCTOR WAFER FOR LAMINATION APPLICATIONS", now abandoned.

BACKGROUND OF THE INVENTION

1. Field of the Invention

The present invention relates, in general, to integrated circuits and, more particularly, to multilayer or three-dimensional integrated circuits and fabrication methods therefor.

2. Description of the Art

Integrated circuits are typically fabricated from semiconductor wafers cut from a large crystal. The semiconductor wafers are generally from 200 $\mu$m to 400 $\mu$m thick and are of uniform crystalline material. The actual integrated circuit is formed on the top surface of the wafer by various doping, oxide, metal deposition and etching processes. Since this provides a basic two-dimensional structure, the overall density of such integrated circuits per given area is limited.

In an effort to overcome this density limit and to produce devices having greater densities, it has been proposed to form semiconductor devices using multiple layers of integrated circuitry. The greatest obstacle in the production of multiple layers of integrated circuits is the solid semiconductor crystalline wafer. Vertical conductive paths are required for multiple layer construction. A solid wafer is not directly usable without expensive and time consuming processing methods used to produce the required vertical conductive paths.

Many ways of forming such multiple layer, integrated circuit devices are known, the most common of which is through the use of alternating layers of insulating material and semiconductive material applied to the semiconductive wafer through various deposition processes, such as chemical vapor deposition or molecular beam epitaxy. Through these processes, multiple layers may be formed with circuits integrated in each semiconductor layer. The main drawback of these processes is that as multiple layers of integrated circuits are formed, the number of defective devices increases. In the basic two-dimensional integrated circuit, each integrated circuit formed on a wafer is tested and the defective circuits discarded. However, in multiple layer integrated circuit devices, as the number of layers increases, a point will be reached at which the number of usable devices approaches zero.

Thus, it would be desirable to provide a semiconductor wafer that could include the vertical conductive paths where required for multiple layer applications. It would also be desirable to provide a semiconductor wafer which has a very thin but mechanically stable structure. It would also be desirable to provide a semiconductor wafer, suitable for multiple layer applications, that can be used with conventional, existing processing techniques and equipment. It would be desirable to provide an integrated circuit having thin layers of semiconductive material constructed in such a manner so as to duplicate the vertical conductive paths used in multiple layer integrated circuit devices as well as the multiple layer surfaces for circuit integration. It would also be desirable to provide a multiple layer integrated circuit device which can be made according to a fabrication process which increases the yield of usable individual integrated circuits. It would also be desirable to provide a multiple layer integrated circuit device which can be constructed using conventional, existing processing techniques and equipment.

SUMMARY OF THE INVENTION

In one embodiment, the present invention is a multiple layer integrated circuit and method of fabrication therefor.

In one embodiment, the multiple layer integrated circuit is formed by the method comprising the steps of:

(1) forming a dissolvable material layer on a top surface of a planar substrate;

(2) disposing a protective material layer over the dissolvable material layer, with the protective material layer extending over the side edges of the dissolvable material layer;

(3) forming at least one electrically conductive post on and extending away from the protective material layer, the electrically conductive post having a predetermined length;

(4) disposing an electrically insulating material layer over the protective material layer and all of the exterior surface of the at least one electrically conductive post;

(5) disposing a semiconductor material over the electrically insulating material layer to at least a top end of the electrically conductive post such that a substantially planar top surface is formed exposing the top end of the at least one electrically conductive post;

(6) forming an electronic or integrated circuit in the top surface of the semiconductive material layer;

(7) forming an electrically conductive pad on the top end of the at least one electrically conductive post;

(8) separating the substrate, the dissolvable material layer and the protective material layer from the electrically insulating material layer; and (9) electrically connecting the electrically conductive posts and pads of a plurality of like formed integrated circuits in a stack.

Preferably, the method also includes the step of forming an enlarged base pad in the insulating material layer which supports each electrically conductive post.

The step of separating the substrate from the integrated circuit layer preferably includes the steps of removing a peripheral flange formed on the protective material layer which surrounds the side edge of the dissolvable material layer to expose the dissolvable material layer to water or other solution to dissolve the material layer and thereby separate the substrate from the protective material layer. The protective material layer is then removed by placing the integrated circuit layer in a suitable acid.

A low temperature melting point layer may be disposed on the exposed ends of the conductive posts to provide electrical and mechanical interconnection between a plurality of like formed integrated circuit dies which are arranged in a stacked alignment. The individual conductive traces on each integrated circuit in each layer are connected to the conductive posts to provide electrical circuit interconnection between the various integrated circuit layers.

The multi-layer integrated circuit laminate of the present invention is ideally suited for use in a high density memory application. In such an application, the memory cells or matrix are formed in a predetermined size on each integrated circuit layer. The memory cells are preferably concentrated towards the center of each integrated circuit die so as to provide peripheral space for the electrically conductive posts extending through each die to adjacent dies. The drivers, sensors and decode logic associated with a typical memory device are preferably formed in a separate integrated circuit layer which is supported by a substrate providing heat sink characteristics. The active circuit is preferably concentrated in the center of the integrated circuit die with the electrically conductive posts being concentrically arranged in rows surrounding the active circuit. Peripheral conductive pads may also be formed on this integrated circuit layer and connected to the posts, the active circuit or to provide connections to other integrated circuits.

In another embodiment, a semiconductor wafer suitable for lamination applications is formed by a process comprising the steps of:

(1) forming a core in the shape of the wafer to be produced from a dissolvable material;

(2) optionally, forming at least one electrically conductive post on and extending away from the dissolvable material core, the electrically conductive post having a predetermined length;

(3) form a layer of electrical insulating material over all surfaces of the dissolvable material core and the optional electrically conductive posts;

(4) disposing one or more semiconductor material layers on the electrical insulating material covering the optional electrically conductive posts and a top surface of the core or, in the case where no conductive posts are constructed, the surface of the core designated as the top surface; and (5) grinding and polishing an exposed surface of the semiconductive material layer so to expose a top end of each of the optional electrically conductive posts or, in the case where no conductive posts are present, to produce a smooth surface, suitable for integrated circuit fabrication. An electronic or integrated circuit is then formed in the semiconductor material layer 138 by normal fabrication processes.

After the fabrication of integrated circuits or other semiconductor devices in the semiconductive material layer 138, the method preferably also includes the post-processing steps of:

(1) grinding a back surface layer and a side edge of the semiconductor material to expose the dissolvable material core;

(2) mounting the wafer in a holding fixture;

(3) dissolving the core material; and (4) separating the individual integrated circuits or semiconductor devices from the wafer.

Preferably the electrically conductive posts also include an enlarged base pad which supports each electrically conductive post.

The step of forming the electrically insulating layer over all surfaces of the dissolvable material core and the optional electrically conductive posts preferably includes the step of oxidizing a thin semiconductor material layer disposed on the core and/or the conductive posts to form an insulating layer around the optional electrically conductive posts and over the exposed surface of the core.

The step of dissolving the core material includes the step of inserting the wafer into a dissolving solution, such as a suitable acid.

A low temperature melting point layer of electrically conductive metal or other suitable alloy may be disposed on the exposed ends of the electrically conductive posts during or after the formation of integrated circuits or other semiconductor devices. The purpose of low temperature melting point layer is to provide electrical and mechanical interconnection between a plurality of like formed integrated circuit dies which are arranged in a stacked alignment. The individual conductive traces on each integrated circuit or semiconductor device are connected to the conductive posts to provide electrical circuit interconnection between the various semiconductor layers arranged in a stacked alignment.

The wafer of the present invention is ideally suited for use in fabricating and constructing multiple layer integrated circuit assemblies.

The multiple layer integrated circuit device and fabrication method therefor of the present invention uniquely enables a thin integrated circuit die to be formed with planar surfaces thereby avoiding surface distortion problems and enabling electrically conductive posts to be formed in and through each integrated circuit layer or die. The dies may be easily interconnected in an aligned stack by electrically and mechanically interconnecting the conductive posts extending through each die thereby providing electrical connection between each integrated circuit layer. This enables a high density integrated circuit device to be formed. The fabrication method of the present invention provides a single thin layer integrated circuit which is strong and rigid enough to remain intact during the various processing steps employed to form an integrated circuit or semiconductor device thereon while at the same time eliminating the expensive and time consuming post processing methodology previously employed to form conductive posts in semiconductor dies.

BRIEF DESCRIPTION OF THE DRAWING

The various features, advantages and other uses of the present invention will become more apparent by referring to the following detailed description and drawing in which.

DESCRIPTION OF THE PREFERRED EMBODIMENTS

Figure 4:
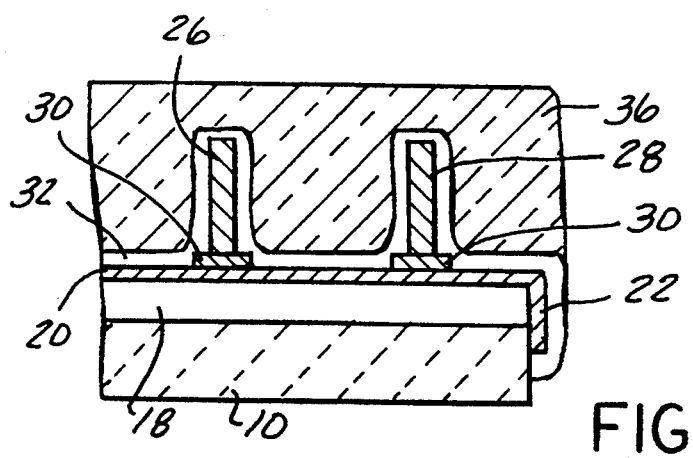
FIGS. 1-8 are partial, cross sectional views showing the sequential steps of one embodiment of the present fabrication method for forming an integrated circuit laminate or layer for use in a multiple layer integrated circuit device.

FIGS. 1–8 depict the various steps of the fabrication method of the present invention used in forming individual integrated circuit lamination layers which are subsequently stacked into a multiple layer integrated circuit device. It should be understood that FIG. 1–8 depict a portion of an overall structure having a predetermined size and shape, such as a generally disc-like shape, which will include a number of identical integrated circuits, as described hereafter.

A substrate 10 is initially provided in a predetermined shape, such as a disc-like shape. The substrate 10 is formed of a suitable rigid material, such as a ceramic, for example only. The substrate 10 has opposed top and bottom surfaces 12 and 14, respectively, and a peripheral side edge 16. The overall size of the substrate 10 could be that of a conventional semiconductor wafer used to form a plurality of integrated circuits.

In a first step, a thin layer 18 of a dissolvable material is formed or disposed by conventional means on the top surface 12 of the substrate 10. The layer 18 may be applied by coating, for example, the top surface 12 of the substrate 10. The dissolvable material forming the layer 18 may be any suitable material which is dissolvable in water or other weak solutions and has a melting point above 1200° C. For example, the dissolvable material can be calcium aluminate or other suitable material. It is also important that the dissolvable material will not react with the semiconductor material used in the present method, as described hereafter.

Figure 1:
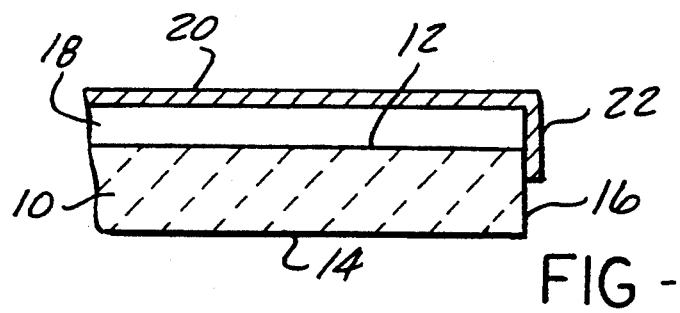

Next, a protective material layer 20 is formed or disposed over the top of the dissolvable material layer 18. The protective material layer 20 is preferably formed of a metallic material, such as chromium, and is applied in such a way so as to form a smooth, flat surface for the formation of an epitaxial layer thereover, as described hereafter. As shown in FIG. 1, the protective material layer 20 is formed with an outer peripheral flange 22 which extends over the entire side edge of the dissolvable material layer 18 and a portion of the side edge 16 of the substrate 10 to completely seal the dissolvable material layer 18 therein. In a next step, a plurality of electrically conductive posts are formed on the top surface 24 of the protective material layer 20. Although only two posts 26 and 28 are shown in FIGS. 2–8, it will be understood that any number of such posts can be formed according to the present invention. Further, the dimensional relationship and position of each of the posts 26, 28, etc., is preferably identical for each individual integrated circuit formed on the substrate 10 so as to enable stacking of such integrated circuits as described hereafter.

In a preferred embodiment, the conductive posts 26 and 28 are each provided with an enlarged base pad 30 which is formed on the top surface 24 of the protective material layer 20 by several layers of metal deposition. The base pad 30 has a larger cross sectional area than the conductive posts 26 and 28 and forms a mechanical lip so as to prevent the unintentional removal of metal from the conductive posts 26 and 28.

The individual conductive posts 26 and 28 are then formed by several layers of metal deposition on each base pad 30. The base pads 30 and the conductive posts 26 and 28 may be formed of any suitable electrically conductive material, such as electrically conductive metals or alloys thereof. Suitable refractory metals, such as titanium, may also be employed. Further, the base pads 30 and the conductive posts 26 and 28 may be formed by any suitable means, such as metal deposition, electro-plating, etc.

The conductive posts 26 and 28 may be of any shape, such as circular or square, in cross section and may be relatively thin, approximately 5 $\mu$m in thickness. However, each post 26 and 28 must extend vertically for the minimum anticipated thickness of the semiconductive material layer which is approximately 25 $\mu$m to 50 $\mu$m.

Figure 3:
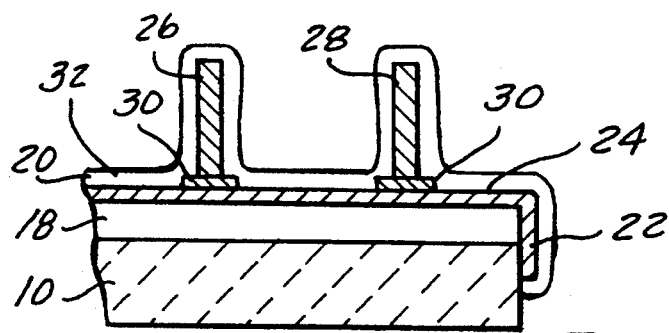
Figure 2:
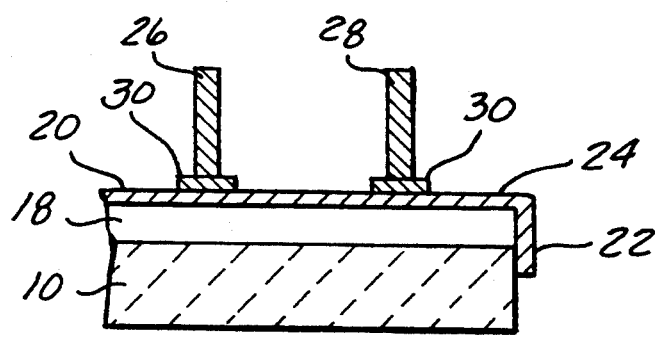

As shown in FIG. 3, in the next step of the present fabrication method, an electrically insulating material layer 32 is disposed or deposited over the entire surface of the protective material layer 20 and the entire peripheral surface of the base pads 30 and the electrically conductive posts 26 and 28. The insulating material layer 30 also extends over the side lip 22 of the protective material layer 20 and into contact with the substrate 10.

The insulating material layer 32 may be formed of any suitable electrically insulating material, such as, for example, calcium fluoride. Oxidized silicon may also be used. The semiconductor materials are then oxidized to form the insulating layer 32 which will ultimately become the bottom surface of each integrated circuit layer or laminate. The insulating material layer 32 provides insulation between the various integrated circuit layers, as described hereafter, and also reduces migration of contaminants throughout the various layers.

Next, a layer 36 of semiconductive material is deposited by suitable means over the insulating material layer 32 and slightly in excess of the height of the conductive posts 26 and 28, as shown in FIG. 4. The semiconductive material layer 36 may be formed by any suitable method, such as molecular beam epitaxy or chemical vapor deposition.

Figure 5:
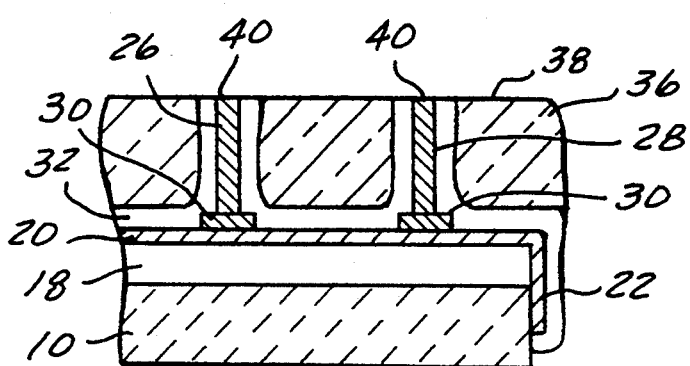

Once the semiconductive material layer 36 has been formed to the desired thickness, the top surface is polished or otherwise treated to remove excess material and to create a flat surface 38, shown in FIG. 5, which exposes the top ends 40 of each conductive post 26, 28, etc. In a next step, the desired circuit is then integrated into the top surface 38 of the semiconductive material layer 36 by standard processes and the required conductive surface traces 39 formed and extending from the integrated circuit to the conductive posts 26, 28, etc.

Figure 7:
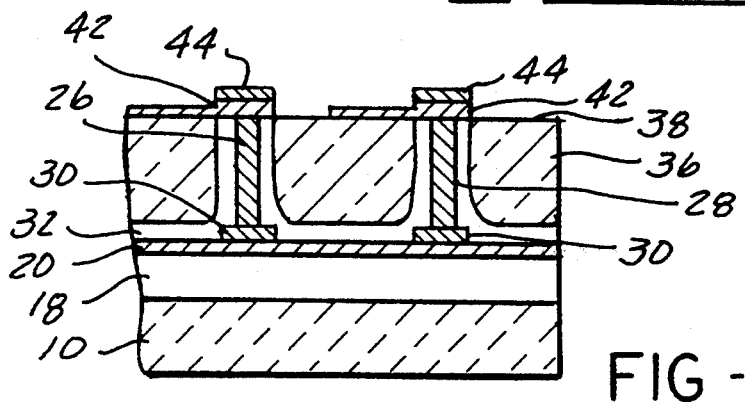
Figure 6:
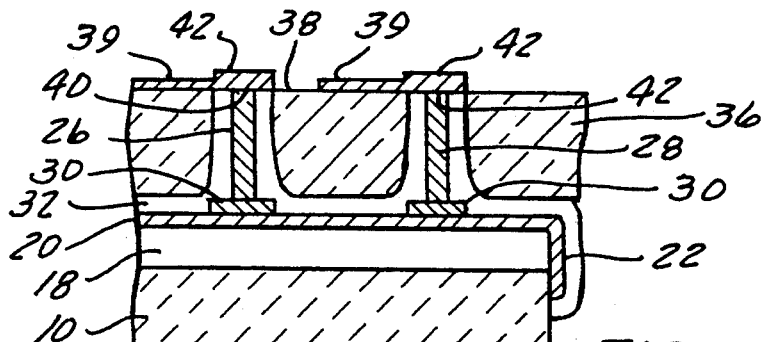

Next, an upper electrically conductive pad 42 is then formed on the exposed top surface 40 of each conductive post 26, 28, etc. The conductive pads 42 may be formed during the formation of the integrated circuit in the semiconductive material layer 36 as part of the conductive surface traces 39. For example only, each upper conductive pad 42 may be formed of a suitable conductive material, such as a metal, i.e., aluminum, etc. As shown in FIG. 7, a low melting point, electrically conductive material layer or pad 44 is then formed or disposed on each upper conductive pad 42. Tin, zinc, or alloys thereof may be used to form the low melting point electrically conductive material layer 44 or pads so as to provide both electrical and mechanical connection between the integrated circuit laminations or layers.

This completes the formation of the integrated circuits on a single wafer. Each circuit may then be tested, with defective circuits being marked in a normal manner for non-use.

In the next step of the present method, the semiconductive layer 36 with its bottom located insulating material layer 32 is separated from the substrate 10 by first removing, such as by grinding, the peripheral edges of the semiconductive material layer 36, the insulating material layer 32 and, more importantly, the peripheral side lip 22 and adjacent flange of insulating material from the peripheral side edge of the substrate 10, as shown in FIG. 7. To facilitate the holding of the relatively thin integrated circuit layer or laminate, a holding means 50 in the form of a vacuum holder is employed to prevent cracking or other damage to the integrated circuit laminate and to provide an easy means for handling the integrated circuit laminate during further processing.

Figure 8:
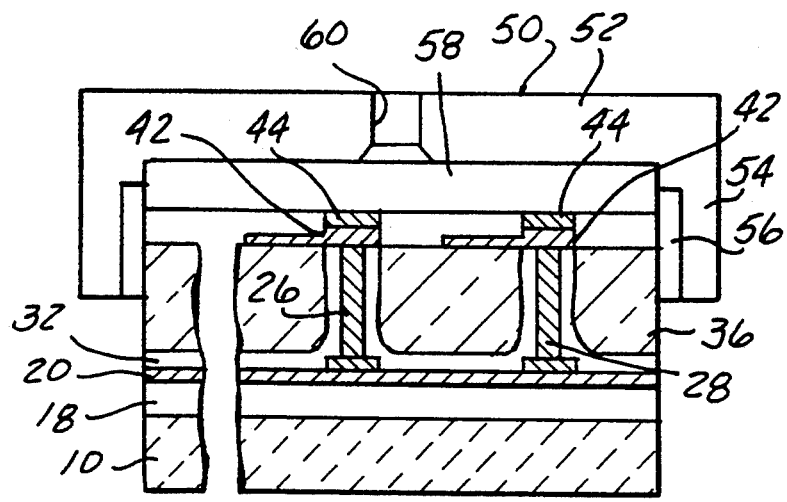

By way of example only, a holding means 50, as shown in FIG. 8, may include a suitably formed holder 52 having a shape slightly larger than the integrated circuit wafer. The holder 52 is formed with an annular rim 54 which surrounds and extends below a portion of the side edge of the semiconductive material layer 36 on the wafer. An annular seal ring 56 is supported in the annular rim 54 of the holder 52 and seals against the peripheral edge of the semiconductive layer 36 and a porous support member 58 mounted in the holder 52. The porous support 58 is formed of any suitable porous material so as to enable a vacuum source applied to an inlet 60 formed in the holder 52 to be used to releasably attach the integrated circuit wafer to the holder 52.

Next, the holder 52 is used to place the integrated circuit laminate in Water or other solution to dissolve the dissolvable material layer 18. Since the peripheral side edge of the dissolvable material layer 18 has been exposed by the grinding or removal step described above, water or any other solution readily dissolves the dissolvable material layer 18 to separate the substrate 10 from the protective material layer 20. The integrated circuit laminate is then placed via the holder 52 into a suitable solution, such as dilute sulfuric acid, so as to remove the protective material layer 20 from the insulating material layer 32 thereby exposing the insulating material layer 32 which forms the bottom surface of the integrated circuit laminate.

The holder 52 is then separated from the integrated circuit lamination or layer by releasing the vacuum therefrom. The individual integrated circuit dies in the laminate are then separated from each other, with the defective dies being discarded. This results in a number of identical, fully operational integrated circuit dies which then may be interconnected into a multiple layer or three-dimensional stack of integrated circuit dies as shown in FIG. 9.

Figure 9:
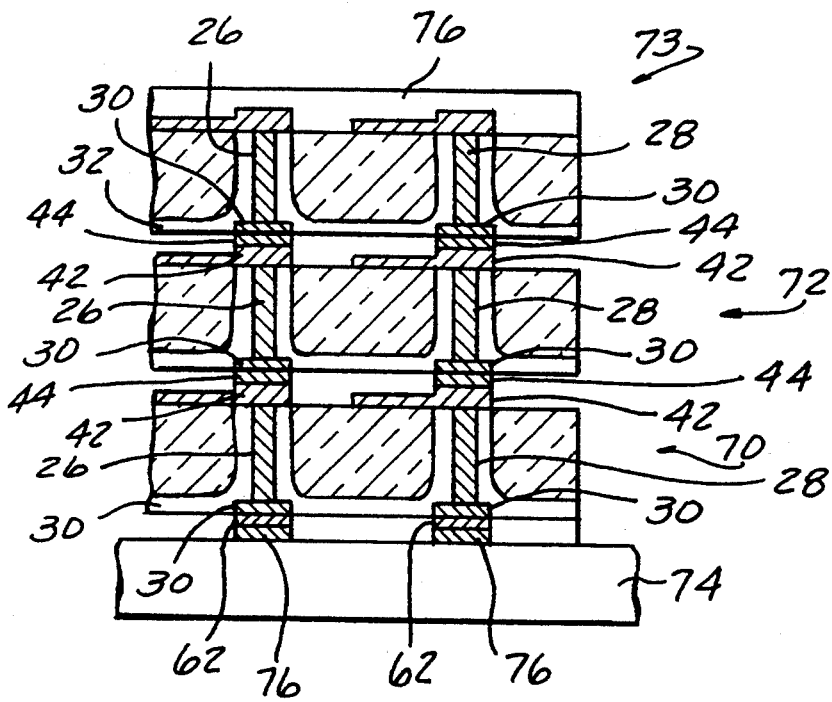
FIG. 9 is a partial, cross sectional view showing the multiple layer stacking of individual integrated circuit laminates made according to the present method and shown in FIGS. 1-8.

A thin coating 62 of a low temperature melding point metal or alloy, similar to the material used to form the pads 44, as described above, is applied to bases 30 on the integrated circuit die 70, shown in FIG. 9, which forms the bottommost lamination of the multiple layer integrated circuit device.

As shown in FIG. 9, a base layer 74 which may be another integrated circuit, a printed circuit board, etc., is provided with conductive base pads 76 which are aligned with and engage the low melting point pads 62 connected to the base pads 30 of the conductive posts 26 and 28 in the lowermost integrated circuit die 70. A number of like integrated circuit dies, shown by reference numbers 72 and 73, are stacked on the integrated circuit die 70, with the bottom base pads 30 of each integrated circuit die 72 and 73 being aligned with the corresponding upper conductive pads 42 of the adjacent die to form a stacked, aligned arrangement of integrated circuit dies 70, 72, 73, etc. It will be understood that the number of individual dies interconnected in a stack may be varied to suit the requirements of a particular application. A topmost layer 76 of a protective insulating material may be applied over the uppermost integrated circuit die 73 to complete the multiple layer integrated circuit device made according to the teachings of the present invention.

A multiple layer integrated circuit device constructed in accordance with the teachings of the above-described method affords several advantages over previously devised multiple layer integrated circuits. A multiple layer integrated circuit device of the present invention has a high density and, further, has a high yield since defective integrated circuits in each layer or laminate are removed before the integrated circuits are arranged in a vertical, stacked arrangement. Further, since each laminated layer is fabricated separately, collective surface distortion which occurs when multiple layers are deposited onto underlying layers is avoided. As such, each integrated circuit layer has its own flat base surface and is not dependent upon the surface geometry of the underlying layers.

Figure 10:
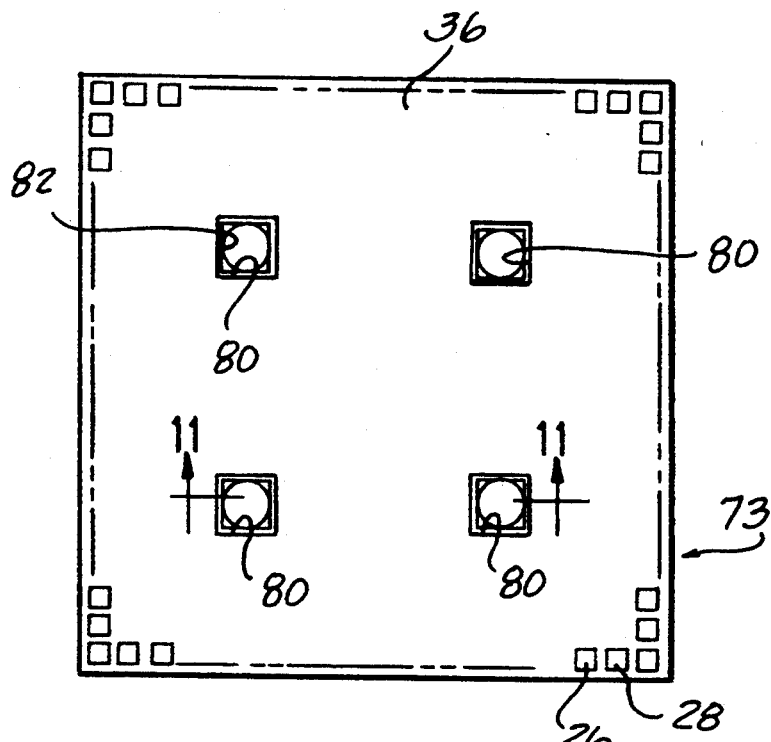
FIG. 10 is a plan elevational view of an alternate embodiment of a multiple layer integrated circuit device constructed in accordance with the teachings of the present invention.
Figure 11:
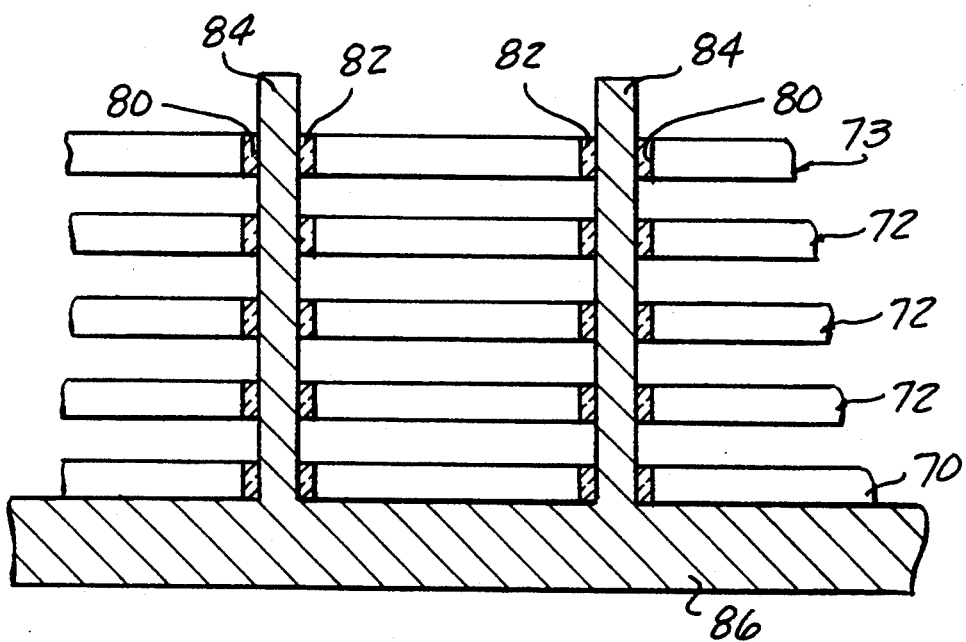
FIG. 11 is a partial, cross sectional view showing the mounting of heat conductors in the integrated circuit device shown in FIG. 10.

Another embodiment of the present invention is shown in FIG. 10 and 11. In this embodiment, FIG. 10 depicts a plan view of the top layer or laminate of an integrated circuit device fabricated according to the present invention, with the top protective insulating layer 76 being removed for clarity. As shown in FIG. 10, the electrically conductive posts, of which only two posts 26 and 28 are numbered, are provided in a predetermined pattern about the periphery of the integrated circuit die forming the laminate 73. Each conductive post is vertically aligned with a corresponding post in an underlying integrated circuit laminate, as described above. The conductive traces from the integrated circuit formed in the semiconductive material 36 are connected to the posts 26, 28, etc., in a normal manner.

Due to the stacked nature of multiple integrated circuit laminates, it may be necessary to remove heat from certain types of electronic circuits formed in the laminates from the interior of the multiple layer integrated circuit device. As such, it is desirable to construct at least some and, preferably, all of the individual integrated circuit dies 70, 72, 73, etc., with open, unused areas in the semiconductive material layers 36. At least one and, preferably, a plurality of apertures 80 are formed in each integrated circuit layer 73 in the open, unused areas thereof. A thin layer of an electrically insulating material is deposited on the exposed surface bounding each aperture 80. Four of such apertures 80 are shown in FIG. 10 by way of example only.

Such apertures 80 may be formed by any suitable means, such as by use of a laser. The apertures 80 in each integrated circuit die 70, 72, 73, etc., are aligned so as to form one or more openings extending continuously through all of the dies or layers in the multiple layer integrated circuit device.

A heat conductive means, such as a metallic rod 84, extends through each coaxial alignment of apertures 80 in the multi-layer integrated circuit stack as shown in FIG. 11. Each conductive rod 84 is insulated from the surrounding integrated circuit by the insulating layer 82, but is capable of transmitting heat generated by the integrated circuits from each layer outward from each die or layer of the multi-layer integrated circuit stack to the top of the stack. An enlarged heat conductive plate 86 may be disposed below the lowermost integrated circuit layer 70 and connected to the plurality of heat conductive rods 84, as shown in FIG. 11.

Figure 13:
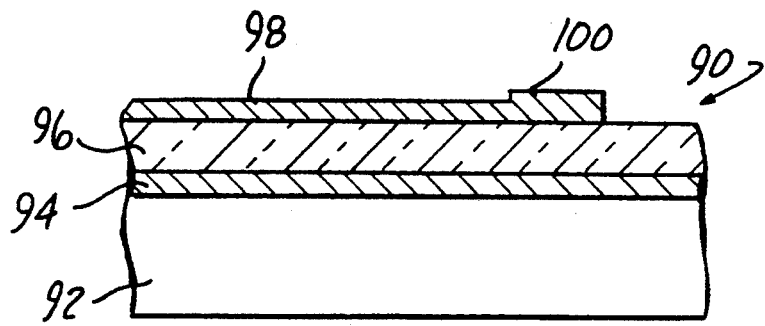
FIG. 13 is a cross sectional view generally taken along line 13—13 in FIG. 12.
Figure 12:
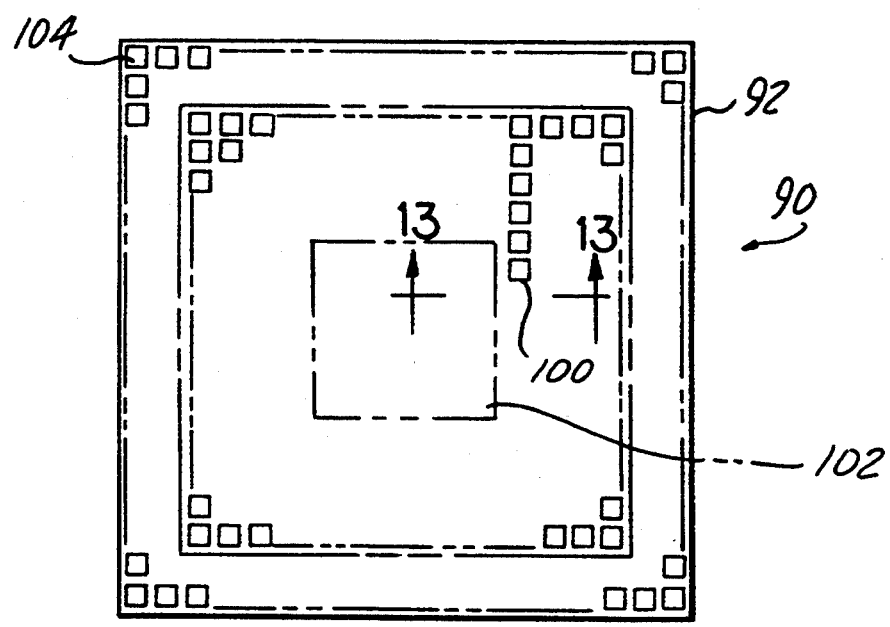
FIG. 12 is a plan view of a base integrated circuit layer of a multiple layer integrated circuit device devised for memory applications.

FIGS. 12 and 13 depict another embodiment of the present multiple layer integrated circuit which is designed specifically for a high density memory application. This application utilizes individual integrated circuit layers or dies constructed in accordance with the fabrication method described above.

The memory circuits can be formed by any conventional crystalline or amorphic process and may be either volatile or non-volatile in nature. Further, the semiconductive material used to form each layer may be any silicon based semiconductor, as well as germanium or GaAs material.

Since the drivers, sensors, and decode logic associated with a memory device are known to generate substantial quantities of heat, according to this embodiment of the present invention, the integrated circuitry forming the drivers, sensors and memory decode logic are concentrated in a central area 102 in a semiconductive layer 96. Surface traces 98 extend outward from the peripheral edges of the integrated circuit to electrically conductive pads 100 mounted on the top surface of the base layer 96. According to the present invention, the conductive pads 100 are arranged in concentric rows, as shown in FIG. 12, for purposes which will be described in greater detail hereafter. Conductive traces 94 are also are formed between the semiconductive material layer 96 and a base layer 92 and extend through the layer 96 to the drivers, etc. The base layer 92 acts as a substrate and may be formed of any suitable material which provides high heat transmissibility. The base 92 thus acts as a heat sink for the active circuit elements formed in the semiconductive material layer 96. Further, as shown in FIG. 12, a plurality of peripherally mounted terminals 104 may also be formed on the base layer 92 and connected to the drivers, decode and sensor circuitry in the layer 96 by the traces 94 to other external integrated circuits.

Figure 14:
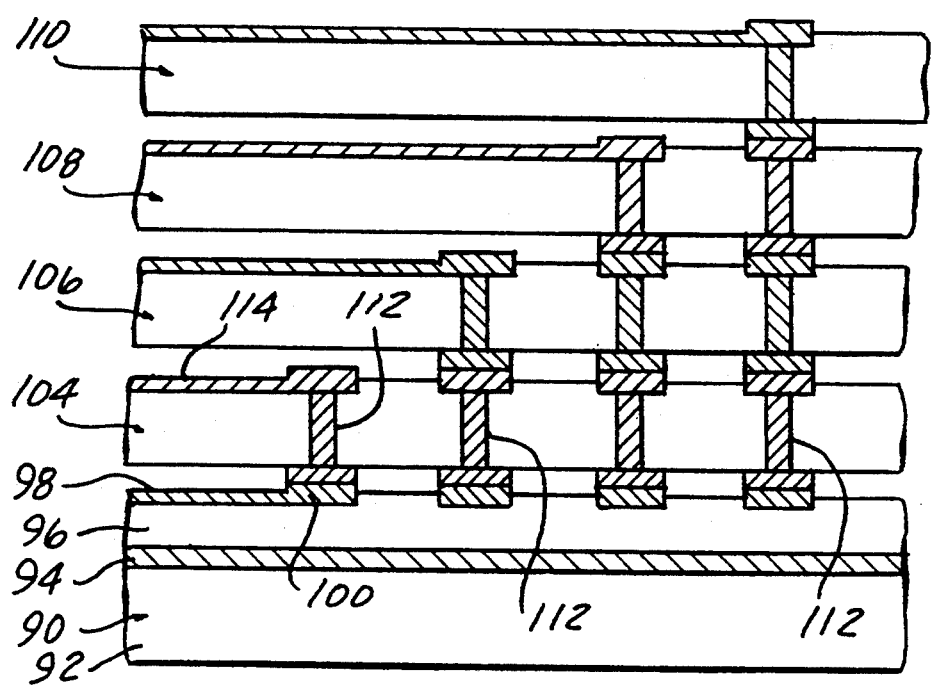
FIG. 14 is a partial, cross sectional view showing a multiple layer integrated circuit device including the layer shown in FIGS. 12 and 13.

Individual integrated circuit layers containing the desired number of memory cells or circuits are stacked in a vertical arrangement over the base layer and semiconductive material layer all denoted generally by reference number 90 as shown in FIGS. 13 and 14. Each of the integrated circuit layers 104, 106, 108 and 110 are formed as described above with through extending electrically conductive posts 112. Each of the posts 112 are electrically connected to one of the conductive pads 100 on the base layer 90 by means of a low temperature melting point material layer similar to the layer 44 described above. Surface conductive traces 114 extend between each of the electrically conductive posts 112 in each layer to the active circuit elements of the integrated circuit formed in each layer.

It will be understood that the number of individual layers 104, 106, 108 and 110 may be varied depending upon the requirements of a particular application. In addition, the size or density of memory cells in each layer may also be varied.

Another feature of this embodiment of the present invention is shown in FIG. 14. As the electrically conductive posts 112 are arranged in concentric rows on the base layer 90 and through the succeeding stacked layers 104, 106, 108 and 110, certain rows of electrically conductive posts may be eliminated from uppermost layers or, even if present, not electrically connected to the next adjacent upper layer as such connections may not be necessary.

Figure 15:

Another fabrication process according to the present invention is shown in FIGS. 15–23. This process is particularly devised for forming a thin, single layer integrated circuit. A core or substrate 130, as shown in FIG. 15, is first formed in a size and shape compatible with existing semiconductor wafers. Preferably, the core or substrate 130 is formed of a dissolvable material such as chromium. This material provides a rigid substrate; while being easily dissolvable so as to be easily removed from the other material layers forming semiconductor wafer.

Figure 16:
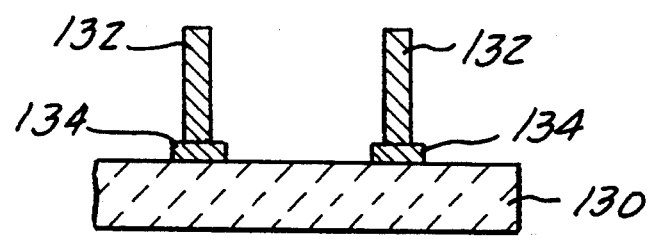

As shown in FIG. 16, the next step of the present method is optional and involves the formation of at least one and preferably a plurality of electrically conductive posts 132. A base pad 134 of a larger cross sectional area than the post 132 is formed on the core or substrate 130 by normal metal deposition and etching. The conductive posts 132 are also formed by metal deposition and etching from a suitable material, such as tungsten. The conductive posts 132 may be of any shape, such as circular or square, in cross section and may be relatively thin, i.e., approximately five μm in thickness. Further, each conductive post 132 extends vertically from the base pad 134 for a suitable distance equal to the minimum anticipated thickness of the semiconductive material layer which will be applied thereover.

It will be understood that the number and dimensional relationship of each of the posts 132 may be varied as desired to suit the particular application of the integrated circuit or semiconductor device to be formed on the core 130. Preferably, for multiple stacking applications, the arrangement of the conductive posts 132 is identical for each integrated circuit die formed on the wafer.

Figure 17:
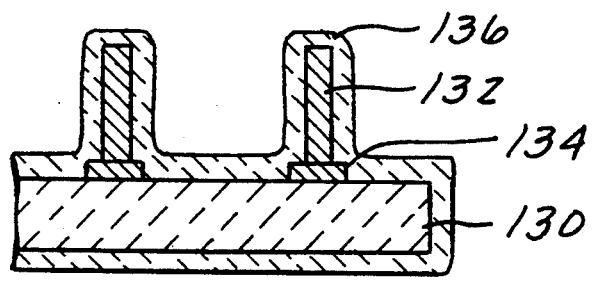

Next, as shown in FIG. 17, the entire top, bottom and side surfaces of the core 130, the base pads 134 and the electrically conductive posts 132 are covered with a thin layer of a protective, electrically insulating material, such as polysilicon 136.

The polysilicon layer 136 is then oxidized to form an electrically insulating layer 136 which surrounds all of the exterior surfaces of the core 130, the base pads 134 and the electrically conductive posts 132.

Figure 18:
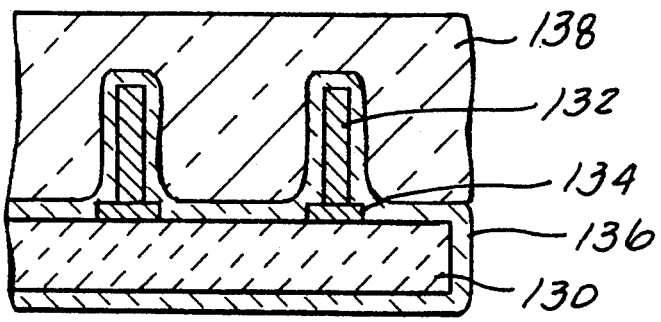
FIGS. 15–19 are partial, cross sectional views showing the sequential steps in a second fabrication method of the present invention used to form a single thin wafer.

As shown in FIG. 18, the next step in the present method involves the application of one or more layers of a single crystalline silicon material 138 over the electrically insulating layer 136 covering the top surface of the core 130, the base pads 134 and the electrically conductive posts 132. The semiconductive material layer 138 completely surrounds all of the exterior surfaces of the electrically conductive posts 132 and the base pads 134. The single crystalline material forming the layer 138 is deposited by suitable means, such as molecular beam epitaxy, chemical vapor deposition, or other suitable processes. Further, the depth of deposition of the layer 138 exceeds the height of the vertical electrically conductive posts 132 and can vary, for example, from five μm to 10 μm.

Figure 19:
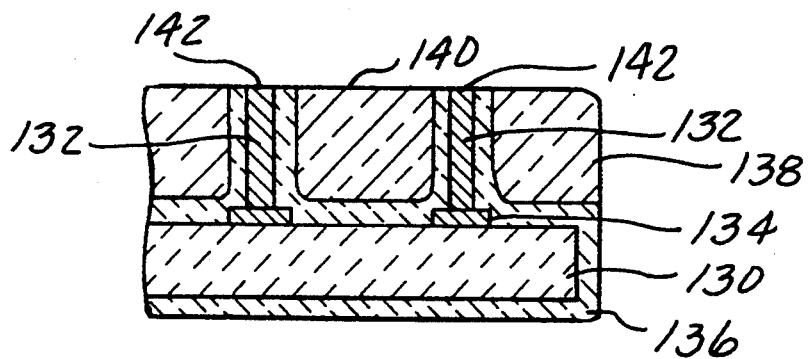

Next, as shown in FIG. 19, the top surface 140 of the semiconductive material layer 138 is ground and polished to expose the top ends 142 of the electrically conductive posts 132. The exposed top end 142 of the conductive posts 132 thus forms a finished surface for the fabrication of integrated circuits or other semiconductor devices. In a construction where conductive posts are not used, the grinding and polishing step forms a smooth surface on the semiconductor layer suitable for integrated circuit formation.

Figure 20:
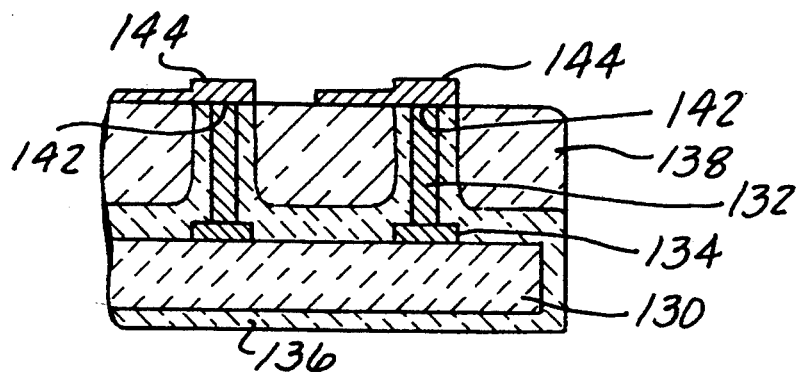

As shown in FIG. 20, a top electrically conductive pad 144 is then formed on the top ends 142 of each of the electrically conductive posts 132. The pads 144 may be formed by suitable means, such as metal deposition and etching, for example only. The conductive pads 144 are formed of a suitable electrically conductive, low temperature melting point material to provide electrical connections through the conductive posts 132 on one integrated circuit die to conductive posts on additional semiconductor dies in different layers of a multiple stack of such integrated circuit dies. Such pads 144 are not needed in the case where the integrated circuit dies formed on the wafer are to be used in a non-stacked application.

Figure 21:
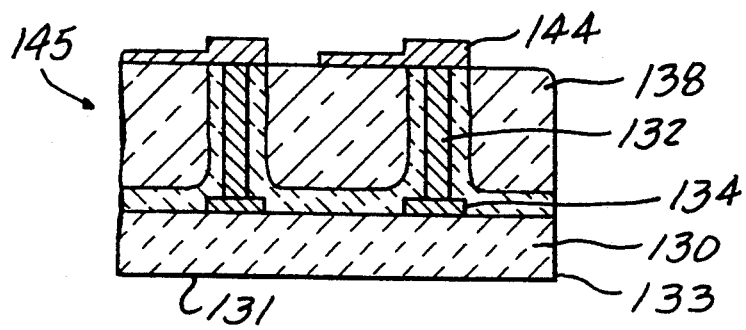

In the next step of the present method, as shown in FIG. 21, the bottom surface 131 of the core or substrate 130 and the peripheral side edge 133 of the core 130 are ground to remove the insulating layer 136 previously disposed thereover and to expose the bottom surface 131 and the side edge surface 133 of the core 130. This essentially forms the wafer 145.

Figure 23:
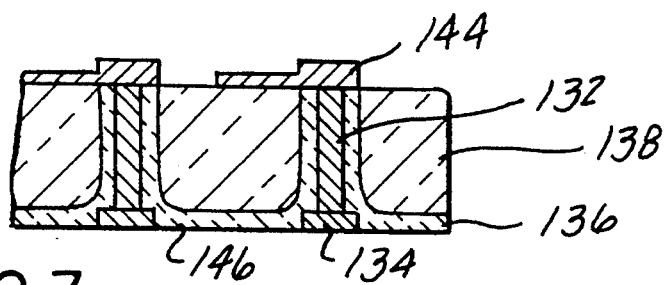
FIGS. 20, 21, 23 and 24 are partial, cross sectional views showing the sequential steps in the post-processing of the wafer shown in FIG. 19 after the semiconductor circuit has been formed in the top surface of the wafer.
Figure 22:
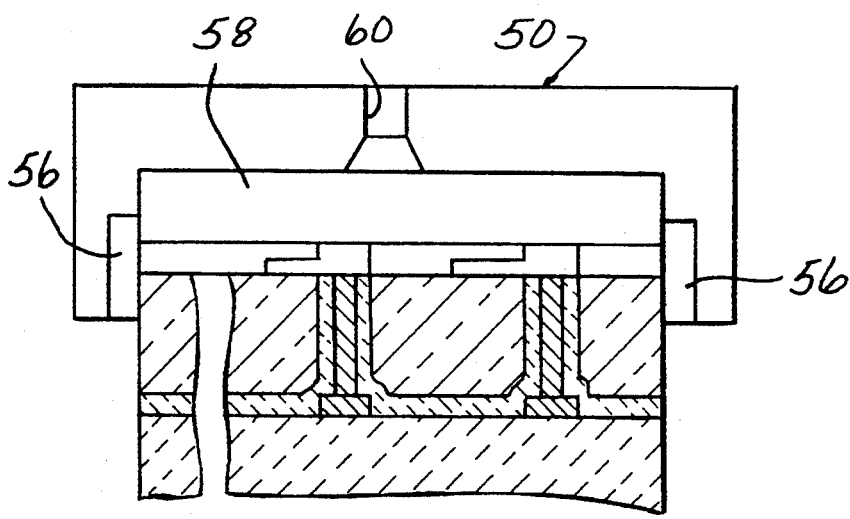
FIG. 22 is a partial, cross sectional view of the holding fixture and wafer used for handling the wafer in FIG. 21.

The wafer 145 is then placed in a suitable holding fixture 50 as shown in FIG. 22. The holding fixture 50 is the same as that described above and shown in FIG. 8. The top surface of the pads 144 is placed against a porous ceramic support 58 mounted in the holder 50. The holder 50 and the wafer 145 mounted therein is then inserted into a dissolving solution such as an acid, i.e., sulfuric acid, to dissolve and remove the core 130, as shown in FIG. 23. This forms a bottom surface 146 after the core 130 has been dissolved and removed from the wafer 145 in which the base pads 134 are exposed and surrounded by the insulating material layer 136.

Figure 24:
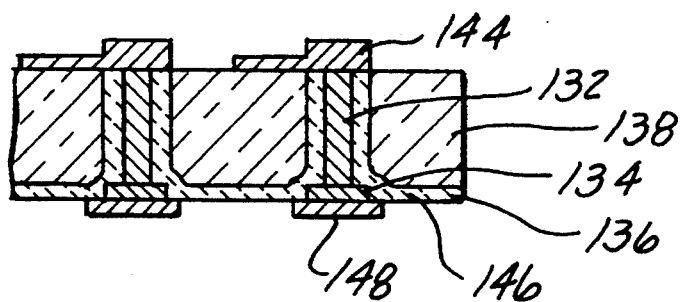

Bottom pads 148 formed of a low temperature melting point, electrically conductive material are then attached to each of the base pads 134 by suitable metal deposition and etching, for example as shown in FIG. 24. The bottom pads 148 provide an electrical and mechanical bond between like formed integrated circuits or other semiconductor devices formed on like wafers 145.

The wafer 145 can then be cut by laser or other suitable means to separate each die from the complete wafer 145.

Figure 25:
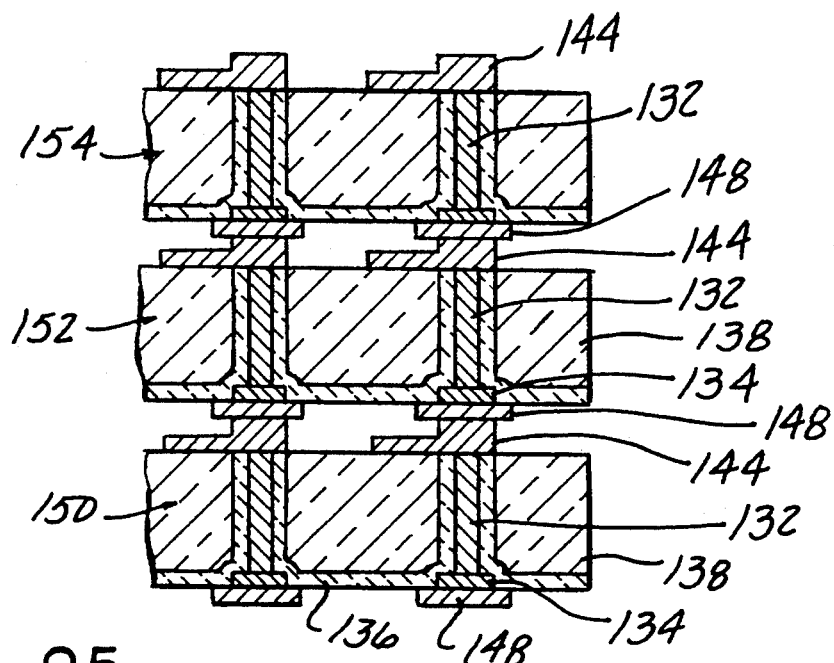
FIG. 25 is a partial, cross sectional view of like formed integrated circuit dies arranged in a stacked alignment.

As shown in FIG. 25, individual dies, only three of which are shown and denoted by reference numbers 150, 152 and 154, may then be assembled in a stacked arrangement with the individual electrically conductive posts 132 vertically aligned through the stack of dies 150, 152 and 154. The aligned conductive posts 132 in each of the dies 150, 152 and 154 are electrically and mechanically connected through the use of a suitable flux and light pressure applied while heating the assembly to the melting point of the top and bottom pads 144 and 148 on each die 150, 152 and 154. This forms a secure connection between all of the die 150, 152 and 154.

In summary, there has been disclosed a unique multiple layer integrated circuit and fabrication method therefor which uniquely provides a high density integrated circuit device which utilizes minimal physical space. The multiple layer integrated circuit device is formed of individual integrated circuit dies having through extending electrically conductive posts. The fabrication method of the present invention enables a thin integrated circuit die to be formed without cracking or other damage and, at the same time, provides the through extending electrically conductive posts for ease of stacking multiple layers into a high density, small volume integrated circuit device. The fabrication method of the present invention provides a single thin layer integrated circuit which is strong and rigid enough to remain intact during the various processing steps employed to form an integrated circuit or semiconductor device thereon while at the same time eliminating the expensive and time consuming post processing methodology previously employed to form conductive posts in semiconductor dies.

What is claimed is:

1. A method for forming a single thin layer integrated circuit device comprising the steps of:
   (1) forming a planar substrate of dissolvable material, the substrate having opposed top and bottom surfaces and side edges;
   (2) disposing a protective material layer over the dissolvable material layer, with the protective material layer extending over at least the top surface and the side edges of the dissolvable material layer;
   (3) disposing a semiconductive material over the protective material layer on the top surface of the substrate;
   (4) forming an integrated circuit in the semiconductive material layer; and
   (5) separating the substrate from the protective material layer to form a single thin layer integrated circuit device.

2. The method of claim 1 further comprising the step of:
   before the step of disposing the protective material layer, forming at least one electrically conductive post on and extending away from the substrate, the electrically conductive post having an exterior surface, a top end, a bottom end and a predetermined length.

3. The method of claim 2 wherein the step of separating comprises the steps of:
   removing the protective material layer from at least one of the bottom surface and the side edges of the dissolvable substrate to expose the substrate;
   dissolving the dissolvable substrate to separate the substrate from the protective material layer; and
   removing the protective layer from the electrically conductive post to expose the top end of at least one electrically conductive post.

4. The method of claim 2 further comprising the steps of:

disposing the protective material layer over the entire surface of the conductive post; and disposing the semiconductive material layer to at least the top end of the conductive post such that a planar top surface is formed on the semiconductive material exposing the top end of the at least one electrically conductive post.

5. The method of claim 2 further comprising the step of:

forming an electrically conductive pad on the top end of the at least one electrically conductive post.

6. The method of claim 2 further comprising the step of:

forming an electrically conductive base pad on the bottom end of the at least one electrically conductive post in contact with the dissolvable substrate.

7. The method of claim 1 further comprising the step of:

forming the protective material layer of an electrically insulating material.

8. The method of claim 5 further comprising the steps of:

forming an electrically conductive base pad on the bottom end of the at least one electrically conductive post; and electrically connecting the at least one electrically conductive post and electrically conductive pads on the top and bottom ends of the electrically conductive post of a plurality of like-formed integrated circuits in a stack.

9. A method for fabricating an integrated circuit device comprising the steps of:

(1) forming a dissolvable material layer on a top surface of a planar substrate, the dissolvable material layer terminating in side edges;

(2) disposing a protective material layer over the dissolvable material layer, with the side edges of the protective material layer extending over the side edges of the dissolvable material layer;

(3) forming at least one electrically conductive post on and extending away from the protective material layer, the electrically conductive post having an exterior surface, top and bottom ends, and a predetermined length;

(4) disposing an electrically insulating material layer over the protective material layer and all of the exterior surface of the at least one electrically conductive post;

(5) disposing a semiconductor material over the electrically insulating material layer to at least a top end of the electrically conductive post such that a substantially planar top surface is formed exposing the top end of the at least one electrically conductive post;

(6) forming an integrated circuit in the top surface of the semiconductive material layer;

(7) forming an electrically conductive pad on the top end of the at least one electrically conductive post;

(8) separating the substrate, the dissolvable material layer and the protective material layer from the electrically insulating material layer; and (9) electrically connecting the electrically conductive posts and pads of a plurality of like formed integrated circuits in a stack.

10. The method of claim 9 further comprising the step of:

forming an electrically conductive base pad on the protective material layer to support the at least one electrically conductive post thereon.

11. The method of claim 9 wherein the step of electrically connecting the posts and pads further comprises:

applying a layer of a low temperature melting point electrically conductive material onto the electrically conductive pad.

12. The method of claim 9 wherein the separating step comprises the steps of:

removing the portion of the protective material layer from the side edges of the dissolvable material layer to expose the side edges of the dissolvable material layer; and disposing the integrated circuit in a fluid to dissolve and remove the dissolvable material layer from the protective material layer.

13. The method of claim 12 further comprising the step of removing the protective material layer from the insulating material layer.

14. The method of claim 9 further comprising the step of forming a plurality of integrated circuits in the semiconductive material layer, each integrated circuit having a plurality of electrically conductive posts extending therethrough arranged in a predetermined positional arrangement with respect to each integrated circuit.

15. The method of claim 11 further comprising the step of:

stacking a plurality of integrated circuits in alignment with the conductive pads of each integrated circuit connected to the conductive posts of adjacent integrated circuits by the low temperature melting point material layer.

* * * * *